United States Patent
Miccoli et al.

(10) Patent No.: US 9,633,719 B2
(45) Date of Patent: Apr. 25, 2017

(54) PROGRAMMING MEMORY CELLS TO BE PROGRAMMED TO DIFFERENT LEVELS TO AN INTERMEDIATE LEVEL FROM A LOWEST LEVEL

(71) Applicant: MICRON TECHNOLOGY, INC., Boise, ID (US)

(72) Inventors: Carmine Miccoli, Boise, ID (US); Christian Caillat, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/724,945

(22) Filed: May 29, 2015

(65) Prior Publication Data
US 2016/0351253 A1    Dec. 1, 2016

(51) Int. Cl.
| | | |
|---|---|---|
| G11C 16/04 | (2006.01) | |
| G11C 11/56 | (2006.01) | |
| G11C 16/34 | (2006.01) | |
| G11C 16/10 | (2006.01) | |

(52) U.S. Cl.
CPC .......... G11C 11/5628 (2013.01); G11C 16/10 (2013.01); G11C 16/3418 (2013.01); G11C 16/3459 (2013.01)

(58) Field of Classification Search
CPC . G11C 11/5628; G11C 16/10; G11C 16/3418; G11C 16/3459
See application file for complete search history.

(56) References Cited

U.S. PATENT DOCUMENTS

| | | | |
|---|---|---|---|
| 6,643,188 B2 | 11/2003 | Tanaka et al. | |
| 7,692,971 B2 | 4/2010 | Moschiano et al. | |
| 2002/0141237 A1* | 10/2002 | Goda | G11C 11/5628 365/185.03 |
| 2009/0010068 A1* | 1/2009 | Lee | G11C 11/5628 365/185.19 |
| 2011/0194352 A1* | 8/2011 | Zhao | G11C 16/0483 365/185.19 |
| 2012/0170364 A1* | 7/2012 | Jang | G11C 11/5628 365/185.03 |
| 2013/0028018 A1* | 1/2013 | Cho | G11C 11/5628 365/185.03 |
| 2014/0247657 A1* | 9/2014 | Jang | G11C 11/5628 365/185.03 |

OTHER PUBLICATIONS

G. Naso, et al., "N-series NAND architecture," Micron-TLP Technical Journal, vol. 4, No. 1, Apr. 2013, 7 Pgs.
(Continued)

*Primary Examiner* — Toan Le
(74) *Attorney, Agent, or Firm* — Dicke, Billig & Czaja, PLLC

(57) ABSTRACT

Embodiments of methods and memory devices for performing the methods are disclosed. In an embodiment, one such method includes programming all memory cells that are to be respectively programmed to different levels other than a lowest level, corresponding to a lowest data state, to an intermediate level from the lowest level and respectively programming all the memory cells that are to be respectively programmed to the different levels other than the lowest level to the different levels other than the lowest level from the intermediate level.

21 Claims, 8 Drawing Sheets

(56) References Cited

OTHER PUBLICATIONS

C. Miccoli, et al., "Investigation of the Programming Accuracy of a Double-Verify ISPP Algorithm for Nanoscale NAND Flash Memories," IEEE 2011, IRPS11 833-838, 6 Pgs.
D. Lee, et al., "A 64Gb 533Mb/s DDR Interface MLC NAND Flash in Sub-20nm Technology," 2012 IEEE International Solid-State Circuits Conference, Session 25, Non-Volatile Memory Solutions, 25.5, 2012, 3 Pgs.

* cited by examiner

PROGRAMMING MEMORY CELLS TO BE PROGRAMMED TO DIFFERENT LEVELS TO AN INTERMEDIATE LEVEL FROM A LOWEST LEVEL

FIELD

The present disclosure relates generally to devices and device programming, and, in particular, the present disclosure relates to methods for programming memory cells to be programmed to different levels to an intermediate level from a lowest level, corresponding to a lowest data state, and devices configured to perform the methods.

BACKGROUND

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use one-transistor memory cells. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. For example, a row of memory cells might be those memory cells commonly coupled to an access line. Columns of the array might include strings (often termed NAND strings) of memory cells connected together in series between a pair of select transistors, e.g., a source select transistor and a drain select transistor. Each source select transistor is connected to a source, while each drain select transistor is connected to a data line, such as bit line.

A "column" may refer to memory cells that are commonly coupled to a data line. It does not require any particular orientation or linear relationship, but instead refers to the logical relationship between memory cell and data line. Note, for example, that for an array having a plurality of memory blocks, a string of memory cells of each memory block might be selectively coupled to a common data line through a drain select transistor.

A row of memory cells can, but need not, include all memory cells commonly coupled to an access line. A row of memory cells might include every other memory cell commonly coupled to an access line. For example, memory cells commonly coupled to an access line and selectively coupled to even data lines may be a row of memory cells, while memory cells commonly coupled to that access line and selectively coupled to odd data lines may be another row of memory cells. Other groupings of memory cells commonly coupled to an access line may also define a row of memory cells. For certain memory devices, all memory cells commonly coupled to a given access line might be deemed a physical row, while those portions of the physical row that are read during a single read operation or programmed during a single program operation (e.g., even or odd memory cells) might be deemed a logical row, sometimes referred to as a page.

Some memory devices might include stacked memory arrays, e.g., often referred to as three-dimensional memory arrays. For example, a stacked memory array might include a plurality of vertical strings (e.g., NAND strings) of memory cells, e.g., coupled in series, between a source and a data line. The term vertical may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

Memory cells, such as non-volatile memory cells, can be programmed to have multiple bits, e.g., during multilevel programming. A memory cell having multiple bits might sometimes be referred to as a multilevel memory cell (e.g., MLC), for example. A respective data value (e.g., as represented by a bit pattern) may be assigned to each of a plurality of levels, where each level corresponds to a respective data state.

Each level (e.g., data state) may be characterized by a corresponding distinct range of threshold voltages (Vts) of a plurality of distinct ranges of threshold voltages that can be stored on the multilevel memory cells. A margin (e.g., a certain number of volts), such as a dead space, may separate adjacent threshold-voltage ranges, e.g., to facilitate differentiating between data values. This technology permits the storage of two or more bits per memory cell. The number of program levels used to represent a bit pattern of N bits may be $2^N$, for example.

Multilevel programming might involve programming a row of multilevel memory cells at a time. For example, programming voltage pulses might be applied to the access line commonly coupled the row of multilevel memory cells in order to shift the threshold voltages of the multilevel memory cells. During the programming, memory cells of the row to be programmed to lower program levels (e.g., lower threshold-voltage ranges) usually reach their assigned threshold voltage before other memory cells coupled to the same access line that are to be programmed higher program levels reach their assigned threshold voltages. This can cause what is known in the art as program disturb issues that can occur when the memory cells in the same row that are already programmed to the lower levels (e.g., threshold-voltage ranges) and/or in an adjacent row of memory cells that are already programmed to the lower levels continue to experience the effects of additional programming pulses used to program remaining memory cells to the higher threshold-voltage ranges.

For the reasons stated above, and for other reasons stated below which will become apparent to those skilled in the art upon reading and understanding the present specification, there is a need in the art for alternatives to existing multilevel programming techniques.

DETAILED DESCRIPTION

Figure 1:
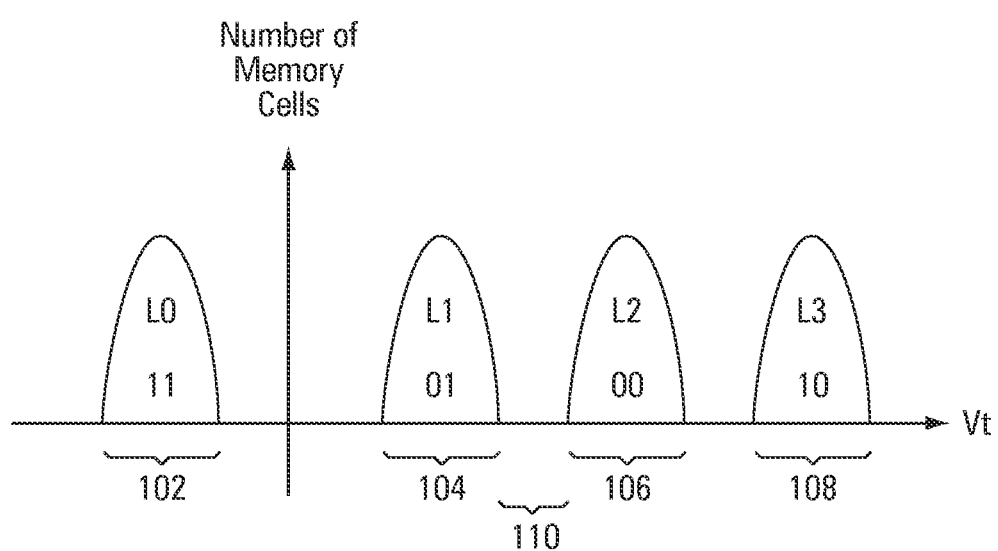
FIG. 1 illustrates an example of different levels to which multilevel memory cells might be programmed.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates, for example, that a non-volatile (e.g., flash) memory cell may be programmed to a threshold voltage Vt that falls within one of four different threshold-voltage ranges, each being used to represent a data state corresponding to a bit pattern comprised of two bits. For example, the threshold-voltage ranges 102, 104, 106, and 108 of FIG. 1 may respectively represent bit values of 11, 01, 00, and 10 and may respectively correspond to levels L0, L1, L2, and L3. However, the embodiments of the present disclosure are not limited only to these bit patterns and are not limited only to four data states. A dead space 110 (which is sometimes referred to as a margin) may be maintained between each level to keep the levels (e.g., threshold-voltage ranges) from overlapping. Levels L1, L2, and L3 might be referred to as program levels, while level L0 might be the lowest level in FIG. 1, corresponding to a lowest data state, such as an erased state in some examples. In some examples, level L0 might correspond to a level after a healing operation or pre-programming operation has been applied after an erase, e.g., to tighten the distribution at the L0 level.

Figure 2:
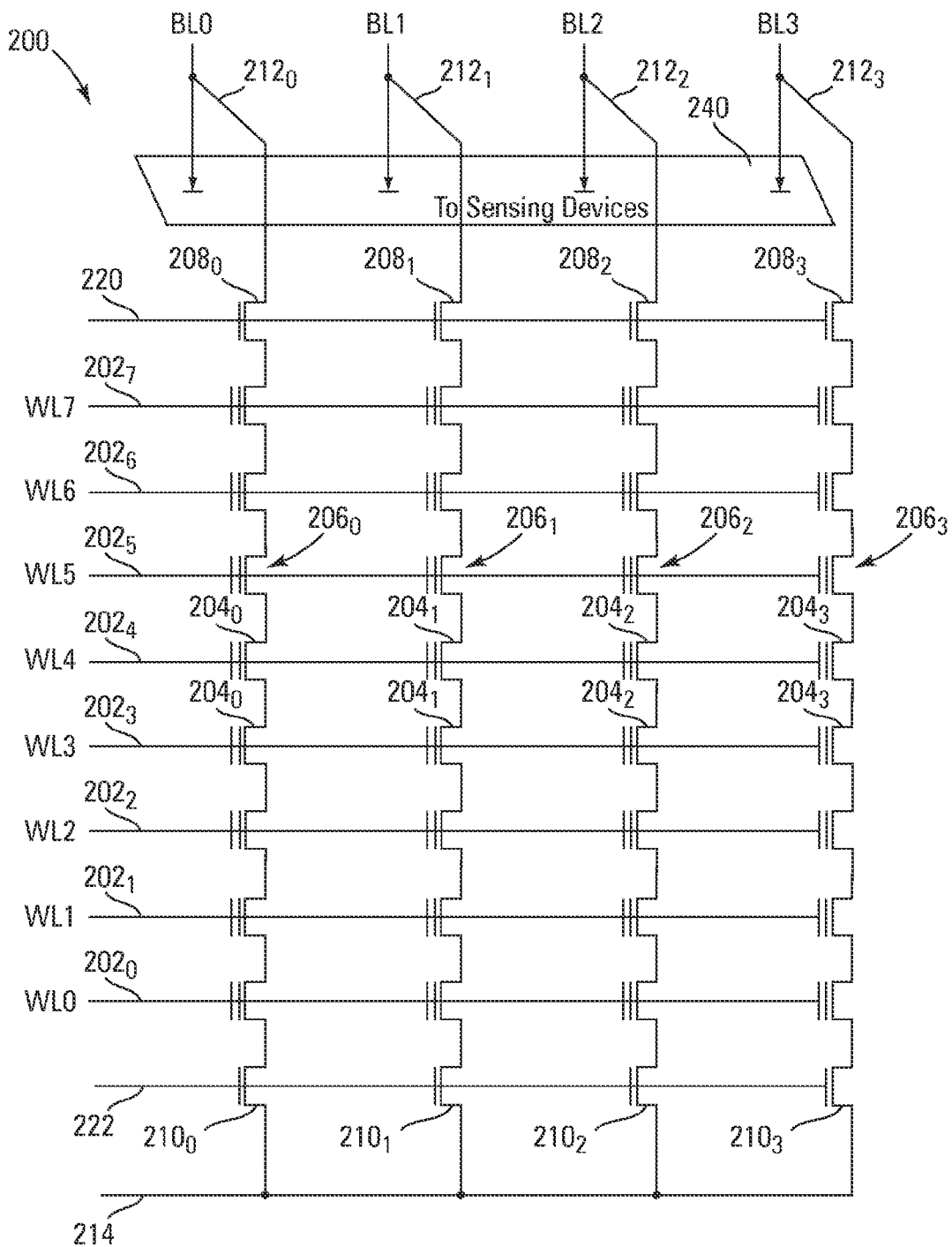
FIG. 2 is a schematic of a NAND memory array, according to another embodiment.

FIG. 2 is a schematic of a memory array 200, such as a NAND memory array, of non-volatile (e.g., flash) memory cells. Each row of memory cells in memory array 200 might be those memory cells commonly coupled to an access line, such as one of word lines WL0 ($202_0$), WL1 ($202_1$), WL2 ($202_2$), WL3 ($202_3$), WL4 ($202_4$), WL5 ($202_5$), WL6 ($202_6$), and WL7 ($202_7$). For example, a row of non-volatile (e.g., flash) memory cells 204, such as memory cells $204_0$ to $204_3$, might be commonly coupled to each of word lines $202_0$ to $202_7$, e.g., as shown for successively (e.g., immediately) adjacent word lines $202_3$ and $202_4$.

Memory cells $204_0$ to $204_3$ might be respectively in series-coupled strings $206_0$ to $206_3$. For example, series-coupled strings $206_0$ to $206_3$ might respectively include memory cells $204_0$ to $204_3$ coupled in series. Each of the series-coupled strings 206 might be between and coupled in series with a select transistor 208, such as a drain select transistor, and a select transistor 210, such as a source select transistor. For example, select transistors $208_0$ to $208_3$ might be configured to respectively selectively couple series-coupled strings $206_0$ to $206_3$ to data lines, such as bit lines BL0 ($212_0$) to BL3 ($212_3$), and select transistors $210_0$ to $210_3$ might be configured to respectively selectively couple series-coupled strings $206_0$ to $206_3$ to a common source 214. Select transistors $208_0$ to $208_3$ might be commonly coupled to an activation line, such as drain select line 220, and select transistors $210_0$ to $210_3$ might be commonly coupled to an activation line, such as source select line 222. Each of the bit lines 212 might be coupled to sensing devices 240, e.g., sense amplifiers.

Memory cells $204_0$ to $204_3$ commonly coupled to a word line 202 might be programmed concurrently, but potentially to different program levels. As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time. In an example, memory cells $204_0$, $204_1$, $204_2$, and $204_3$ might be respectively programmed to the levels L0, L1, L2, and L3 in FIG. 1.

Although, in some of the examples discussed herein, the memory cells $204_0$, $204_1$, $204_2$, and $204_3$ commonly coupled to both word lines $202_3$ and $202_4$ are respectively programmed to the levels L0, L1, L2, and L3, the memory cells $204_0$, $204_1$, $204_2$, and $204_3$ commonly coupled to word lines $202_3$ and $202_4$ might be respectively programed to different levels. For example, the memory cells $204_0$, $204_1$, $204_2$, and $204_3$ commonly coupled to word line $202_3$ might be respectively programmed to levels L0, L1, L2, and L3, whereas the memory cells $204_0$, $204_1$, $204_2$, and $204_3$ commonly coupled to word line $202_4$ might be respectively programmed to levels L3, L2, L1, and L0.

Some of the examples discussed herein depict a single memory cell (e.g., a single memory cell $204_0$) coupled to a word line programmed to level L0, another single memory cell (e.g., a single memory cell $204_1$) coupled to that same word line programmed to level L1, another single memory cell (e.g., a single memory cell $204_2$) coupled to that same word line programmed to level L2, and another single memory cell (e.g., a single memory cell $204_3$) coupled to that same word line programmed to level L3. However, a plurality of memory cells (e.g., a plurality of memory cells $204_0$) coupled to a word line can be programmed to level L0; another plurality of memory cells (e.g., a plurality of memory cells $204_1$) coupled to that same word line can be programmed to level L1; another plurality of memory cells (e.g., a plurality of memory cells $204_2$) coupled to that same word line can be programmed to level L2; and another plurality of memory cells (e.g., a plurality of memory cells $204_3$) coupled to that same word line can be programmed to level L3.

Memory arrays, such as NAND memory arrays, might be erased in blocks so that all of the memory cells in the block are returned to a common state. This common state may be referred to as the erased state and might be the lowest level L0 in FIG. 1. For example, programming a memory cell $204_0$, e.g., coupled to word line $202_3$, to level L0 might include leaving that memory cell $204_0$ in its lowest data state, e.g., by fully inhibiting memory cell $204_0$ from being programmed while programming the memory cells $204_1$ to $204_3$ commonly coupled to word line $202_3$ respectively to levels L1 to L3. For example, while a voltage is applied to a word line a fully inhibited memory cell coupled to that word line might remain at a program level it was at before the voltage is applied.

Memory array 200 might be programmed a row at a time, e.g., using what might be referred to as single-pass programming. For example, single-pass programming might generally involve programming the memory cells to their respective program levels in succession, e.g., starting from level L0. To program the memory cells $204_1$, $204_2$, and $204_3$ commonly coupled to word line $202_3$ respectively to levels L1, L2, and L3, a plurality of program voltage pulses might be applied to word line $202_3$ while memory cell $204_0$ is fully inhibited from programming so that memory cell $204_0$ remains at level L0. The respective pulses may be respectively incremented by a program step voltage until memory cell $204_1$ is at level L1, at which point memory cell $204_1$ is fully inhibited from further programming.

Additional incremented programming pulses might then be applied to word line $202_3$, while memory cells $204_0$ and $204_1$ are fully inhibited from programming, until memory cell $204_2$ is programed to level L2, at which point memory cell $204_2$ is fully inhibited from further programming. Additional incremented programming pulses might then be applied to word line $202_3$, while memory cells $204_0$ to $204_2$ are fully inhibited from programming, until memory cell $204_3$ is programed to level L3.

The additional programming pulses used to program memory cells to higher levels might cause undesirable shifts, e.g., sometimes referred to as program disturb, to the threshold voltages of the memory cells coupled to the same word line that are already programmed to lower levels and to the threshold voltages of the memory cells coupled to adjacent word lines that are already programmed to lower levels. For example, the additional programming pulses needed to program the memory cell $204_3$ coupled to word line $202_3$ to level L3 in the present example can cause undesirable shifts in the threshold voltages of the already programmed memory cells $204_0$ to $204_2$ coupled to word line $202_3$ and to already programmed memory cells $204_0$ to $204_3$ commonly coupled to adjacent word lines 202, such as immediately adjacent word line $202_4$, especially to the memory cells $204_0$ at level L0.

Program disturb can be caused by a parasitic capacitance coupling between the charge storage structures (e.g., floating gates) of adjacent memory cells, such as between the charge storage structures of memory cells commonly coupled to adjacent word lines (e.g., word lines $202_3$ and $202_4$) or between charge storage structures of memory cells in adjacent strings (e.g., strings $206_1$ and $206_2$), can be a problem. A capacitive coupling might occur, for example, between the charge storage structures of already programmed memory cells coupled to word line $202_3$ and the charge storage structures of the memory cells coupled to word line $202_4$ while the memory cells coupled to word line $202_4$ are being programmed, especially between memory cells coupled to word line $202_3$ that are at level L0 while memory cells coupled to word line $202_4$ are being programmed to level L3.

Such a capacitive coupling might be referred to as charge-storage-structure-to-charge-storage-structure (e.g., floating-gate-to-floating-gate) interference (e.g., aggression) and can cause the shifts in the threshold-voltages. The shifts in the threshold voltages of the already programmed memory cells can result in an increased row-bit error rate, e.g., the number of failed bits during a read, and can result in wider threshold-voltage ranges, e.g., that can degrade programming performance.

Other single-pass programming methods are known. For example, some single-pass programming methods might program the memory cells commonly coupled to a word line by partially inhibiting the memory cells by different amounts to help facilitate the memory cells reaching their desired levels concurrently. That is, for example, different partial inhibit voltages might be applied to the bit lines respectively coupled to the strings of memory cells that respectively include those memory cells. In the present example, the memory cells $204_1$, $204_2$, and $204_3$ commonly coupled to word line $202_3$ might be partially inhibited to the reach their respective levels L1, L2, and L3 concurrently. For example, a memory cell $204_1$ might be partially inhibited by a larger amount than memory cell $204_2$ is partially inhibited, and memory cell $204_3$ might not be inhibited at all. However, the already programmed memory cells commonly coupled to the adjacent word lines can be program disturbed by this type of single-pass programming.

Multiple-pass programming, such as two-pass programming (e.g., the two-pass programming described in commonly assigned U.S. Pat. No. 7,855,913), might be used to program memory array 200. For example, two-pass programming might include a first pass that might be referred to as lower-page programming and a second pass that might be referred to as upper-page programming.

The lower-page programming might involve programming, to an intermediate level (e.g., intermediate state), the memory cells whose lower-page bit (e.g., the right bit in FIG. 1) that is to be different than the lower page bit at level L0 (e.g., corresponding to the lowest data state). For example, the memory cells $204_2$ and $204_3$ that are to be respectively programed to levels L2 and L3 are each to have a lower page bit of zero (0). That is, for example, the memory cells $204_2$ and $204_3$ commonly coupled to word lines $202_3$ and $202_4$ might be respectively programed from level L0 to the intermediate program level. During lower-page programming, the memory cells $204_0$ and $204_1$ on the respective word lines $202_3$ and $202_4$ whose lower page bits are be the same as the lower page bit at level L0 may be fully inhibited from being programed.

After the lower-page programming of memory cells $204_2$ and $204_3$ on word lines $202_3$ and $202_4$ to the intermediate program level, the upper-page programming programs the upper bits (e.g., the left bits in FIG. 1) of the memory cells commonly coupled to word line $202_3$. For example, a pre-read might be performed on the memory cells $204_1$ to $204_4$ commonly coupled to word line $202_3$ to determine whether the upper-page programming should start from level L0 in the case of programming memory cell $204_1$ from level L0 to level L1 or from the intermediate program level in the case of programming memory cell $204_2$ from the intermediate program level to level L2 or in the case of programming memory cell $204_3$ from the intermediate program level to level L3. The upper-page programming then programs memory cell $204_1$ from level L0 to level L1, memory cell $204_2$ from the intermediate program level to level L2, and memory cell $204_3$ from the intermediate program level to level L3. The upper-page programming might then repeat the process for the memory cells commonly coupled to word line $202_4$.

The lower-page programming can increase programming time, and the pre-read can result in errors in the placement of the threshold-voltage ranges respectively corresponding to levels L1 to L3.

Figure 3:
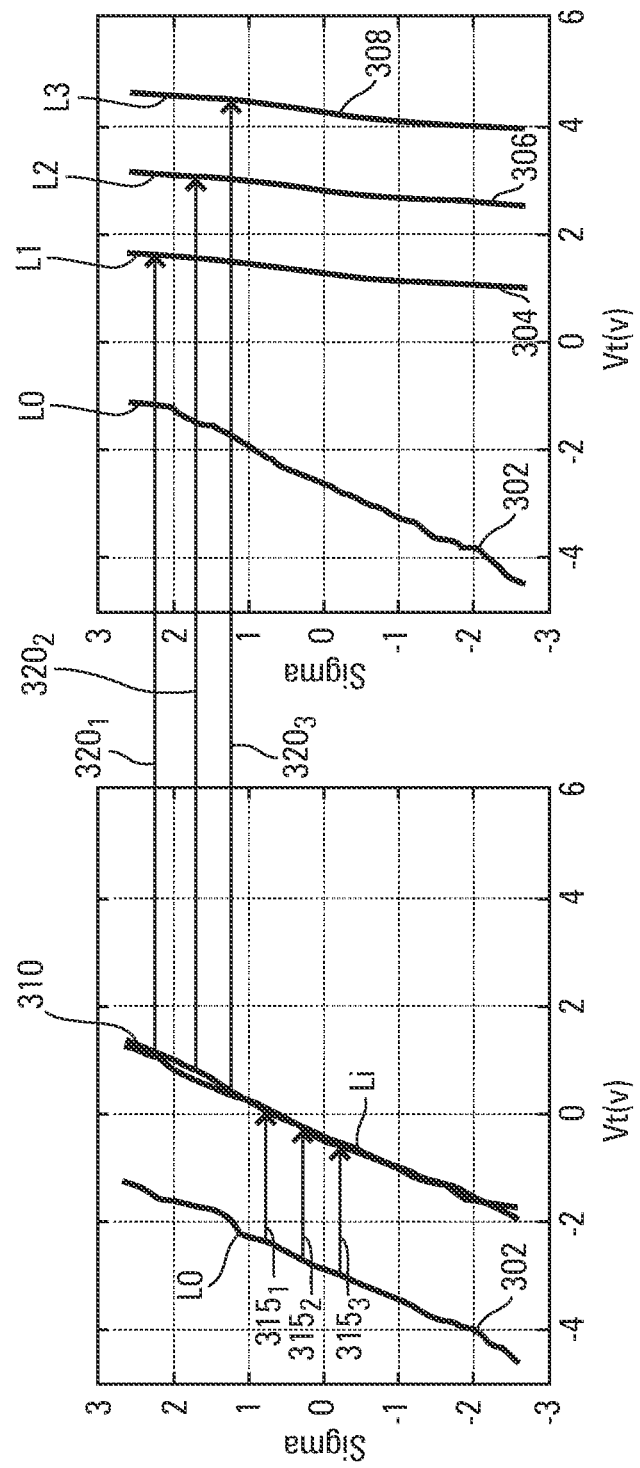
FIG. 3 illustrates programming multilevel memory cells, according to an embodiment.

FIG. 3 illustrates an example of programming array 200, according to an embodiment. The programming in FIG. 3 is an example of what might be referred to as blanket 1.5-pass programming. The plots 302, 304, 306, 308, and 310 in FIG. 3 represent threshold-voltage (Vt) ranges for respectively corresponding program levels. For example, the plots 302, 304, 306, and 308 respectively represent the Vt ranges 102, 104, 106, and 108 respectively for levels L0, L1, L2, and L3 in FIG. 1.

The Vt corresponding to the maximum sigma value in the respective plots 302, 304, 306, and 308 corresponds to the maximum Vt of the respective Vt ranges 102, 104, 106, and 108 in FIG. 1; the Vt corresponding to the minimum sigma value in the respective plots 302, 304, 306, and 308 corresponds to the minimum Vt of the respective Vt ranges 102, 104, 106, and 108; and the Vt corresponding to sigma=0 in the respective plots 302, 304, 306, and 308 corresponds to the Vt in the center of the respective Vt ranges 102, 104, 106, and 108. Plot 310 represents the Vt range for an intermediate level Li (e.g., an intermediate state).

In FIG. 3, for example, a voltage, such as a blanket voltage, might be applied to word line $202_3$ after memory cells $204_0$ to $204_3$ (e.g., after all the memory cells in array 200) are brought to level L0. For example, the blanket voltage might program (e.g., shift) each of the memory cells $204_1$ to $204_3$ commonly coupled to word line $202_3$ from level L0 to intermediate level Li, while memory cell $204_0$ is fully inhibited from programming in response to the blanket voltage so that memory cell $204_0$ remains at level L0. That is, for example, all of the memory cells of a grouping of memory cells, such as a physical page of memory cells, e.g., commonly coupled to word line $202_3$, that are to be programmed to a level other than level L0, might be programmed from level L0 to intermediate level Li. Arrows $315_1$ to $315_3$ in FIG. 3 respectively illustrate memory cells $204_1$ to $204_3$ being programmed from level L0 to intermediate level Li in response to the blanket voltage. For example, in the programming of FIG. 3, all memory cells of a grouping of memory cells that are to be programmed to levels other than level L0 might be programmed to intermediate level Li.

Note that in programming a memory cell to the intermediate level Li, there may be no need to verify or otherwise determine if that memory cell has reached a particular threshold voltage, i.e., the intermediate level Li may represent whatever threshold voltage that memory cell reaches in response to the blanket voltage. For various embodiments, the blanket voltage may be selected such that only a portion of the memory cells selected for programming and receiving the blanket voltage would be expected to reach a threshold voltage corresponding to the level L1 in response to the blanket voltage. For some embodiments, the blanket voltage may be selected such that no memory cell receiving the blanket voltage would be expected to reach a threshold voltage corresponding to the level L1 in response to the blanket voltage. In other words, for example, the expected range of threshold voltages of intermediate level Li may be partially overlapping with, or entirely below, the range of threshold voltages of the level L1.

The blanket voltage might be applied, for example, while none of the memory cells $204_1$ to $204_3$ commonly coupled to word line $202_3$ is inhibited from being programmed, e.g., while a bias voltage of zero volts is applied to the bit lines $212_1$ to $212_3$ respectively coupled to the strings $206_1$ to $206_3$ that respectively include memory cells $204_1$ to $204_3$. For example, select transistors $208_0$ to $208_3$ might be activated to respectively couple bit lines $212_0$ to $212_3$ respectively to strings $206_0$ to $206_3$. Memory cell $204_0$ might be fully inhibited by applying an inhibit voltage (e.g., Vcc) to the bit line $212_0$ coupled to the string $206_0$ that includes memory cell $204_0$ while select transistors $208_0$ to $208_3$ are activated.

Subsequently, in a manner similar to (e.g., the same as) that described for the memory cells $204_0$ to $204_3$ commonly coupled to word line $202_3$, each of the memory cells $204_1$ to $204_3$ commonly coupled to word line $202_4$ may be programmed from level L0 to intermediate level Li by applying the blanket voltage to word line $202_4$ while none of memory cells $204_0$ to $204_3$ coupled to word line $202_4$ is inhibited from being programmed and while memory cell $204_0$ coupled to word line $202_4$ is fully inhibited from programming so that it remains at level L0. That is, for example, all of the memory cells of a grouping of memory cells, e.g., commonly coupled to word line $202_4$, that are to be programmed to a level other than level L0, might be programmed from level L0 to intermediate level Li.

After programming the memory cells $204_1$ to $204_3$ commonly coupled to word lines $202_3$ and $202_4$ to intermediate level Li in response to the blanket voltage, the memory cells $204_1$, $204_2$, and $204_3$ commonly coupled to word line $202_3$ may be respectively programmed to levels L1, L2, and L3, starting from intermediate level Li, e.g., using single-pass programming. The memory cells $204_1$, $204_2$, and $204_3$ commonly coupled to word line $202_3$ might not be read or verified while they are at the intermediate level Li, e.g., prior to respectively programming them to levels L1, L2, and L3. The memory cell $204_0$ coupled to word line $202_3$ may be fully inhibited from programming so that it remains at level L0 while the memory cells $204_1$ to $204_3$ commonly coupled to word line $202_3$ are respectively programmed to levels L1, L2, and L3 from intermediate level Li.

Programming the memory cells $204_1$, $204_2$, and $204_3$ commonly coupled to word line $202_3$ may include, for example, programming memory cells $204_1$, $204_2$, and $204_3$ respectively to levels L1, L2, and L3 from intermediate level Li while memory cell $204_0$ is fully inhibited from programming so that memory cell $204_0$ remains at level L0. Arrows $320_1$, $320_2$, and $320_3$ in FIG. 3 respectively illustrate memory cells $204_1$, $204_2$, and $204_3$ being respectively programmed to levels L1, L2, and L3 from intermediate level Li.

After programming the memory cells $204_1$, $204_2$, and $204_3$ commonly coupled to word line $202_3$ respectively to levels L1, L2, and L3, the memory cells $204_1$, $204_2$, and $204_3$ commonly coupled to word line $202_4$ may be respectively programmed to levels L1, L2, and L3, starting from intermediate level Li, e.g., using single-pass programming. The memory cells $204_1$, $204_2$, and $204_3$ commonly coupled to word line $202_4$ might not be read or verified while they are at the intermediate level Li, e.g., prior to respectively programming them to levels L1, L2, and L3. The memory cell $204_0$ coupled to word line $202_4$ may be fully inhibited from programming so that it remains at level L0 while the memory cells $204_1$, $204_2$, and $204_3$ commonly coupled to word line $202_4$ are respectively programmed to levels L1, L2, and L3 from intermediate level Li.

Programming the memory cells $204_1$, $204_2$, and $204_3$ commonly coupled to word line $202_4$ to the intermediate level Li may reduce the average difference between the threshold voltages of the memory cells $204_1$, $204_2$, and $204_3$ commonly coupled to word line $202_4$ and the threshold voltages of the already programmed memory cells $204_0$ to $204_3$ commonly coupled to word line $202_3$. This can act to reduce the charge-storage-structure-to-charge-storage-structure interference between the already programmed memory cells $204_0$ to $204_3$ commonly coupled to word line $202_3$ and the memory cells $204_1$ to $204_3$ commonly coupled to word line $202_4$ while the memory cells $204_1$ to $204_3$ commonly coupled to word line $202_4$ are being programmed. The programing discussed above in conjunction with FIG. 3 may reduce the width of the threshold-voltage ranges for levels L1 to L3 (e.g., by about 20 percent) compared to some single-pass programming methods without significantly increasing the programming time. Reducing the width of the threshold-voltage ranges facilitates larger margins, which can improve reliability.

Figure 4:
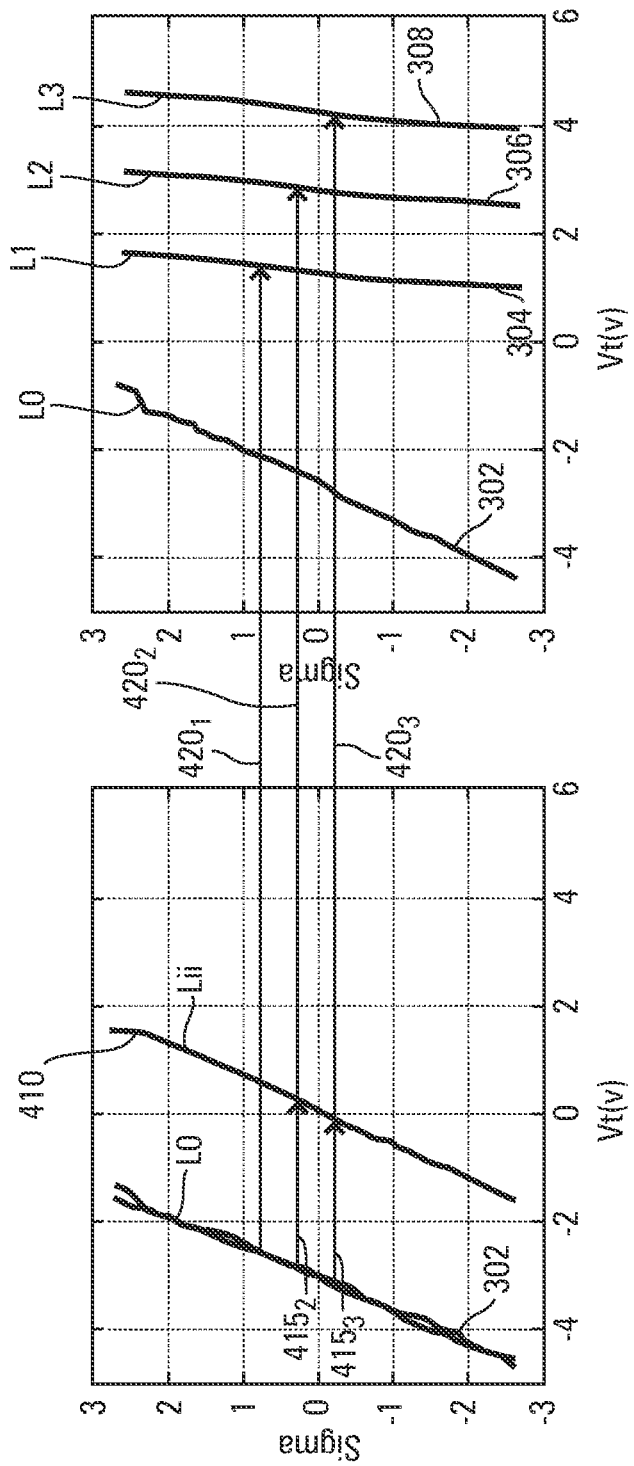
FIG. 4 illustrates programming multilevel memory cells, according to another embodiment.

FIG. 4 illustrates an example of programming array 200, according to an embodiment. FIG. 4 is laid out in a manner similar to that described above for FIG. 3. For example, the common numbering and symbols in FIGS. 3 and 4 might be as defined above in conjunction with FIG. 3. Plot 410 represents the Vt range for an intermediate level Lii (e.g., an intermediate state) that might be higher (e.g., might have greater Vts for common sigma values) than intermediate level Li in FIG. 3. The programming in FIG. 4 is another example of blanket 1.5-pass programming.

In FIG. 4, for example, a blanket voltage might be applied to word line $202_3$ after memory cells $204_0$ to $204_3$ (e.g., after all the memory cells in array 200) are brought to level L0. For example, the blanket voltage might program (e.g., shift) each of the memory cells $204_2$ and $204_3$ commonly coupled to word line $202_3$ from level L0 to intermediate level Lii while memory cells $204_0$ and $204_1$ commonly coupled to word line $202_3$ are fully inhibited from being programmed in response to the blanket voltage so that memory cells $204_0$ and $204_1$ remain at level L0, and while none of memory cells $204_2$ and $204_3$ commonly coupled to word line $202_3$ is inhibited from programming. Memory cells $204_0$ and $204_1$ might be fully inhibited by applying an inhibit voltage (e.g., Vcc) to the bit lines $212_0$ and $212_1$ respectively coupled to the strings $206_0$ and $206_1$ that respectively include memory cells $204_0$ and $204_1$ while select transistors $208_0$ to $208_3$ are activated. The blanket voltage in the programming of FIG. 4 might be greater than the blanket voltage in the programming of FIG. 3 in order to program memory cells $204_2$ and $204_3$ to the higher intermediate level Lii. Arrows $415_2$ and $415_3$ in FIG. 4 respectively illustrate memory cells $204_2$ and $204_3$ being programmed from level L0 to intermediate level Lii in response to the blanket voltage.

Similar to intermediate level Li, there may be no need to verify or otherwise determine if a memory cell has reached a particular threshold voltage with regard to intermediate level Lii, i.e., the intermediate level Lii may represent whatever threshold voltage that memory cell reaches in response to the blanket voltage. For various embodiments, the blanket voltage may be selected such that the expected range of threshold voltages of intermediate level Lii may be partially overlapping with, or entirely below, the range of threshold voltages of the level L1.

Subsequently, in a manner similar to (e.g., the same as) that described in conjunction with FIG. 4 for the memory cells $204_0$ to $204_3$ commonly coupled to word line $202_3$, each of the memory cells $204_2$ and $204_3$ commonly coupled to word line $202_4$ may be programmed from level L0 to intermediate level Lii by applying the blanket voltage to word line $202_4$ while the memory cells $204_0$ and $204_1$ commonly coupled to word line $202_4$ are fully inhibited from being programmed in response to the blanket voltage so that memory cells $204_0$ and $204_1$ remain at level L0 and while none of memory cells $204_2$ and $204_3$ commonly coupled to word line $202_4$ is inhibited from programming.

After programming the memory cells $204_2$ and $204_3$ commonly coupled to word lines $202_3$ and $202_4$ to intermediate level Lii in response to the blanket voltage, the memory cells $204_1$, $204_2$, $204_3$ commonly coupled to word line $202_3$ may be respectively programmed to levels L1, L2, and L3, e.g., using single-pass programming. The memory cells $204_2$ and $204_3$ commonly coupled to word line $202_3$ might not be read or verified while they are at the intermediate level Lii, e.g., prior to programming them respectively to levels L2 and L3.

Programming the memory cells $204_1$ to $204_3$ commonly coupled to word line $202_3$ may include, for example, programming memory cell $204_1$ from level L0 to level L1 and programming memory cells $204_2$ and $204_3$ from intermediate level Lii respectively to levels L2 and L3 while memory cell $204_0$ is fully inhibited from programming so that it remains at level L0. Arrow $420_1$ in FIG. 4 illustrates programming memory cell $204_1$ directly from level L0 to level L1, e.g., without first being programed to intermediate level Lii, and arrows $420_2$ and $420_3$ in FIG. 4 respectively illustrate memory cells $204_2$ and $204_3$ being respectively programmed to levels L2 and L3 from intermediate level Lii.

After programming the memory cells $204_1$, $204_2$, and $204_3$ commonly coupled to word line $202_3$ respectively to levels L1, L2, and L3, the memory cells $204_1$, $204_2$, and $204_3$ commonly coupled to word line $202_4$ may be respectively programmed to levels L1, L2, and L3, e.g., using single-pass programming. The memory cells $204_2$ and $204_3$ commonly coupled to word line $202_4$ might not be read or verified while they are at the intermediate level Lii, e.g., prior to programming them respectively to levels L2 and L3.

Programming the memory cells $204_1$ to $204_3$ commonly coupled to word line $202_4$ may include, for example, programming memory cell $204_1$ directly from level L0 to level L1 and programming memory cells $204_2$ to $204_3$ respectively to levels L2 and L3 from intermediate level Lii while memory cell $204_0$ is fully inhibited from programming so that memory cell $204_0$ remains at level L0.

Programming memory cell $204_1$ directly from level L0 to level L1, as indicated by arrow 422 in FIG. 4, while programming memory cells $204_2$ and $204_3$ respectively to levels L2 and L3 from intermediate level Lii, as respectively indicated by arrows $420_2$ and $420_3$ in FIG. 4, may reduce the potential for over programming memory cell $204_1$ that could potentially occur when programming memory cell $204_1$ starting from intermediate level Lii, e.g., in the event intermediate level Lii is greater than the intermediate level Li depicted in FIG. 3. For example, the programming in FIG. 4 allows intermediate level Lii to be higher than the intermediate level Li for the programming in FIG. 3 and thus a greater blanket voltage to be applied in the programming of FIG. 4 than in the programming of FIG. 3.

The charge-storage-structure-to-charge-storage-structure interference may be greater between memory cells at lower levels, such as levels L0 and L1, and memory cells coupled to an adjacent word line being programmed to higher levels, such as levels L2 and L3, e.g., especially between memory cells at L0 and memory cells being programmed to level L3. Programming memory cells that are to be programed to levels L2 and L3 to the higher intermediate level Lii, as in FIG. 4, may act to reduce this interference compared to when memory cells to be programed to levels L1 to L3 are programmed to the lower intermediate level Li, as in FIG. 3, while potentially reducing the likelihood of over programming memory cells that are to be programmed to level L1 that might occur when programming these memory cells to the higher intermediate level Lii. The programing discussed above in conjunction with FIG. 4 may reduce the width of the threshold-voltage ranges for levels L1 to L3 (e.g., by about 20 percent) compared to some single-pass programming methods without significantly increasing the programming time.

Figure 5:
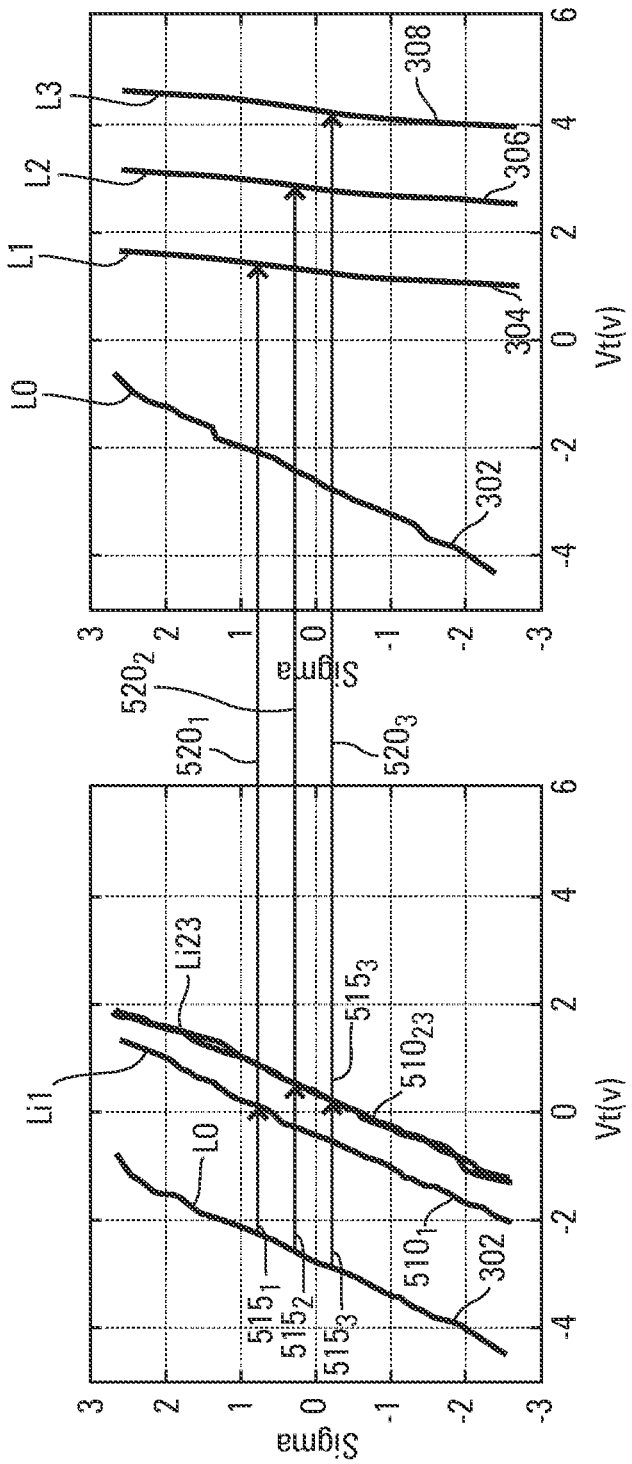
FIG. 5 illustrates programming multilevel memory cells, according to another embodiment.

FIG. 5 illustrates an example of programming array 200, according to an embodiment. FIG. 5 is laid out in a manner similar to that described above for FIG. 3. For example, the common numbering and symbols in FIGS. 3 and 5 might be as defined above in conjunction with FIG. 3. In FIG. 5, plots $510_1$ and $510_{23}$ respectively represent Vt ranges for intermediate levels Li1 and Li23. Intermediate level Li23 might be higher (e.g., might have greater Vts for common sigma values) than intermediate level Li1. The programming in FIG. 5 is another example of blanket 1.5-pass programming.

Similar to other intermediate levels, there may be no need to verify or otherwise determine if a memory cell has reached a particular threshold voltage with regard to intermediate levels Li1 or Li23, i.e., the intermediate levels Li1 and Li23 may represent whatever threshold voltage that memory cell reaches in response to the blanket voltage and their respective level of inhibiting. For various embodiments, the blanket voltage and levels of inhibiting may be selected such that the expected range of threshold voltages of intermediate level Li1 may be partially overlapping with, or entirely below, the range of threshold voltages of the level L1; and such that the expected range of threshold voltages of intermediate level Li23 may be partially overlapping with, or entirely below, the range of threshold voltages of the level L2.

In FIG. 5, for example, a blanket voltage might be applied to word line $202_3$ after memory cells $204_0$ to $204_3$ (e.g., after all the memory cells in array 200) are brought to level L0. For example, the blanket voltage might program (e.g., shift) each of the memory cells $204_2$ and $204_3$ commonly coupled to word line $202_3$ from level L0 to intermediate level Li23, while memory cell $204_1$ coupled to word line $202_3$ is partially inhibited so that the blanket voltage programs memory cell $204_1$ from level L0 to intermediate level Li1, while memory cell $204_0$ coupled to word line $202_3$ is fully inhibited from being programmed in response to the blanket voltage so that memory cell $204_0$ remains at level L0, and while none of memory cells $204_2$ to $204_3$ commonly coupled to word line $202_3$ is inhibited from programming.

Arrow $515_1$ in FIG. 5 illustrates partially inhibited memory cell $204_1$ being programmed from level L0 to intermediate level Li1 in response to the blanket voltage, and arrows $515_2$ and $515_3$ in FIG. 5 respectively illustrate uninhibited memory cells $204_2$ and $204_3$ being programmed from level L0 to intermediate level Li23 in response to the blanket voltage. For example, partially inhibited memory cell $204_1$ and uninhibited memory cells $204_2$ and $204_3$ might respectively reach intermediate level Li1 and intermediate level Li23 concurrently. That is, for example, partially inhibited memory cell $204_1$ may program more slowly in response to the blanket voltage than uninhibited memory cells $204_2$ and $204_3$.

Memory cell $204_0$ might be fully inhibited by applying an inhibit voltage (e.g., Vcc) to the bit line $212_0$ coupled to the string $206_0$ that includes memory cells $204_0$ while select transistors $208_0$ to $208_3$ are activated. Memory cell $204_1$ might be partially inhibited by applying a partial inhibit voltage to the bit line $212_1$ coupled to the string $206_1$ that includes memory cells $204_1$ while select transistors $208_0$ to $208_3$ are activated. The partial inhibit voltage (e.g., 2 volts) might be between the voltages (e.g., zero (0) volts) applied to the bit lines $212_2$ and $212_3$ that do not inhibit the memory cells $204_2$ and $204_3$ and the voltage (e.g., Vcc) applied to bit line $212_0$ that fully inhibits memory cell $204_0$. For example, the partial inhibit voltage might be greater than the voltages applied to the bit lines $212_2$ and $212_3$ that do not inhibit the memory cells $204_2$ and $204_3$ and less than the voltage applied to bit line $212_0$ that fully inhibits memory cell $204_0$.

Subsequently, in a manner similar to (e.g., the same as) that described in conjunction with FIG. 5 for the memory cells $204_0$ to $204_3$ commonly coupled to word line $202_3$, each of the memory cells $204_2$ and $204_3$ commonly coupled to word line $202_4$ may be programmed from level L0 to intermediate level Li23 by applying the blanket voltage to word line $202_4$ while memory cell $204_1$ coupled to word line $202_4$ is partially inhibited so that the blanket voltage programs memory cell $204_1$ from level L0 to intermediate level Li1, while memory cell $204_0$ coupled to word line $202_4$ is fully inhibited from being programmed in response to the blanket voltage so that memory cell $204_0$ remains at level L0, and while none of memory cells $204_2$ to $204_3$ commonly coupled to word line $202_4$ is inhibited from programming.

After programming the uninhibited memory cells $204_2$ and $204_3$ commonly coupled to word lines $202_3$ and $202_4$ to intermediate level Li23 and the partially inhibited memory cells $204_1$ coupled to word lines $202_3$ and $202_4$ to intermediate level Li1 in response to the blanket voltage, the memory cells $204_1$, $204_2$, and $204_3$ commonly coupled to word line $202_3$ may be respectively programmed to levels L1, L2, and L3, e.g., using single-pass programming. The memory cells $204_2$ and $204_3$ commonly coupled to word line $202_3$ might not be read or verified while they are at the intermediate level Li23, e.g., prior to programming them respectively to levels L2 and L3, and memory cell $204_1$ coupled to word line $202_3$ might not be read or verified while it is at the intermediate level Li1, e.g., prior to programming it to level L1.

Programming the memory cells $204_1$ to $204_3$ commonly coupled to word line $202_3$ may include, for example, programming memory cell $204_1$ from intermediate level Li1 to level L1 and programming memory cells $204_2$ and $204_3$ from intermediate level Li23 respectively to levels L2 and L3 while memory cell $204_0$ is fully inhibited from programming so that it remains at level L0. Arrow $520_1$ in FIG. 5 illustrates memory cell $204_1$ being programmed from intermediate level Li1 to level L1, and arrows $520_2$ and $520_3$ in FIG. 4 respectively illustrate memory cells $204_2$ and $204_3$ being respectively programmed to levels L2 and L3 from intermediate level Li23.

After programming the memory cells $204_1$, $204_2$, and $204_3$ commonly coupled to word line $202_3$ respectively to levels L1, L2, and L3, the memory cells $204_1$, $204_2$, and $204_3$ commonly coupled to word line $202_4$ may be respectively programmed to levels L1, L2, and L3, e.g., using single-pass programming. The memory cells $204_2$ and $204_3$ commonly coupled to word line $202_4$ might not be read or verified while they are at the intermediate level Li23, e.g., prior to programming them respectively to levels L2 and L3, and memory cell $204_1$ coupled to word line $202_4$ might not be read or verified while it is at the intermediate level Li1, e.g., prior to programming it to level L1.

Programming the memory cells $204_1$ to $204_3$ commonly coupled to word line $202_4$ may include, for example, programming memory cell $204_1$ from intermediate level Li1 to level L1 and programming memory cells $204_2$ and $204_3$ from intermediate level Li23 respectively to levels L2 and L3 while memory cell $204_0$ is fully inhibited from programming so that it remains at level L0.

Programming memory cell $204_1$ from intermediate level Li1 to level L1, as indicated by arrow $520_1$ in FIG. 5, while programming memory cells $204_2$ and $204_3$ respectively to levels L2 and L3 from intermediate level Li23, as respectively indicated by arrows $520_2$ and $520_3$ in FIG. 5, may reduce the potential for over programming memory cell $204_1$ that could potentially occur when programming memory cell $204_1$ starting from intermediate level Li23 or intermediate level Lii in FIG. 4, e.g., in the event intermediate levels Li23 and Lii are greater than the intermediate level Li depicted in FIG. 3. For example, the programming in FIG. 5 allows intermediate level Li23 for memory cells $204_2$ and $204_3$ to be higher than the intermediate levels Li and Lii for memory cells $204_2$ and $204_3$ respectively depicted in FIGS. 3 and 4 and allows the intermediate level Li1 for memory cell $204_1$ to be higher than the level L0 depicted in FIG. 4. Allowing intermediate level Li1 for memory cell $204_1$ to be higher than level L0 may act to reduce the charge-storage-structure-to-charge-storage-structure interference between memory cells at level L0 and memory cells coupled to an adjacent word line being programmed to level L1, for example.

The programing discussed above in conjunction with FIG. 5 may reduce the width of the threshold-voltage ranges for levels L1 to L3 (e.g., by about 30 percent) compared to some single-pass programming methods without significantly increasing the programming time.

Figure 6:
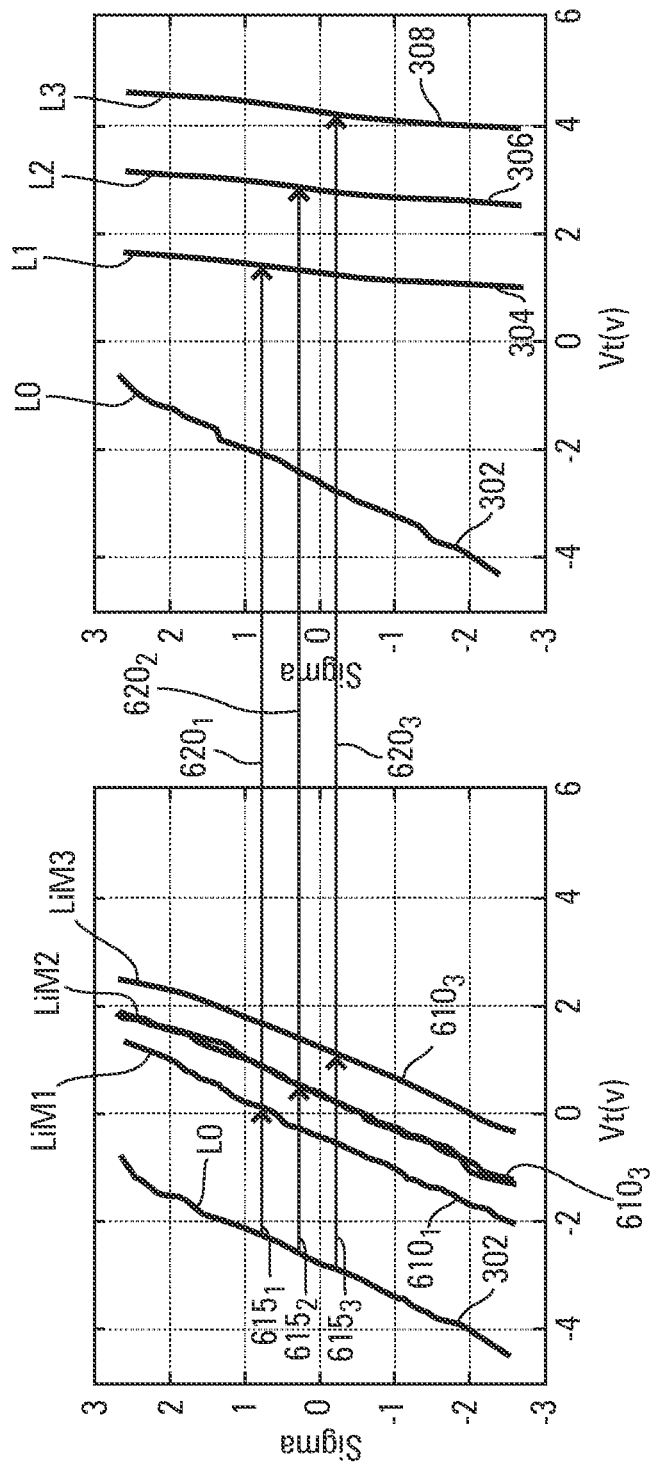
FIG. 6 illustrates programming multilevel memory cells, according to another embodiment.

FIG. 6 illustrates an example of programming array 200, according to an embodiment. FIG. 6 is laid out in a manner similar to that described above for FIG. 3. For example, the common numbering and symbols in FIGS. 3 and 6 might be as defined above in conjunction with FIG. 3. In FIG. 6, plots $610_1$, $610_2$, and $610_3$ respectively represent Vt ranges for intermediate levels LiM1, LiM2, and LiM3. Intermediate level LiM2 might be higher (e.g., might have greater Vts for common sigma values) than intermediate level LiM1, and intermediate level LiM3 might be higher (e.g., might have greater Vts for common sigma values) than intermediate levels LiM1 and LiM2. The programming in FIG. 6 is another example of blanket 1.5-pass programming.

Similar to other intermediate levels, there may be no need to verify or otherwise determine if a memory cell has reached a particular threshold voltage with regard to intermediate levels LiM1, LiM2 or LiM3, i.e., the intermediate levels LiM1, LiM2 and LiM3 may represent whatever threshold voltage that memory cell reaches in response to the blanket voltage and its respective level of inhibiting. For various embodiments, the blanket voltage and levels of inhibiting may be selected such that the expected range of threshold voltages of intermediate level LiM1 may be partially overlapping with, or entirely below, the range of threshold voltages of the level L1; such that the expected range of threshold voltages of intermediate level LiM2 may be partially overlapping with, or entirely below, the range of threshold voltages of the level L2; and such that the expected range of threshold voltages of intermediate level LiM3 may be partially overlapping with, or entirely below, the range of threshold voltages of the level L3.

In FIG. 6, for example, a blanket voltage might be applied to word line $202_3$ after memory cells $204_0$ to $204_3$ (e.g., after all the memory cells in array 200) are brought to level L0. For example, memory cells $204_1$, $204_2$, and $204_3$ that are to be respectively programed to levels L1, L2, and L3 are respectively programmed to different intermediate levels LiM1, LiM2, and LiM3 in response to the blanket voltage being applied to the word line $202_3$.

The blanket voltage might program (e.g., shift) memory cell $204_3$ coupled to word line $202_3$ from level L0 to intermediate level LiM3 while memory cell $204_2$ coupled to word line $202_3$ is partially inhibited so that the blanket voltage programs memory cell $204_2$ from level L0 to intermediate level LiM2, while memory cell $204_1$ coupled to word line $202_3$ is partially inhibited so that the blanket voltage programs memory cell $204_1$ from level L0 to intermediate level LiM1, while memory cell $204_0$ coupled to word line $202_3$ is fully inhibited from being programmed in response to the blanket voltage so that memory cell $204_0$ remains at level L0, and while memory cell $204_3$ coupled to word line $202_3$ is not inhibited from programming. The memory cells that are respectively programmed to intermediate levels LiM1, LiM2, and LiM3 might include all of the memory cells of a grouping of memory cells, e.g., commonly coupled to word line $202_3$, to be respectively programmed to the levels L1, L2, and L3 other than level L0.

Arrow $615_1$ in FIG. 6 illustrates partially inhibited memory cell $204_1$ being programmed from level L0 to intermediate level LiM1 in response to the blanket voltage; arrow $615_2$ in FIG. 6 illustrates partially inhibited memory cell $204_2$ being programmed from level L0 to intermediate level LiM2 in response to the blanket voltage; and arrow $615_3$ illustrates uninhibited memory cell $204_3$ being programmed from level L0 to intermediate level LiM3 in response to the blanket voltage. For example, partially inhibited memory cell $204_1$, partially inhibited memory cell $204_2$, and uninhibited memory cell $204_3$ might respectively reach intermediate levels LiM1, LiM2, and LiM3 concurrently. For example, partially inhibited memory cell $204_1$ may program more slowly than partially inhibited memory cell $204_2$, and partially inhibited memory cell $204_2$ may program more slowly than uninhibited memory cell $204_3$. Memory cells $204_1$ and $204_2$ might be partially inhibited by different amounts in order to respectively program to intermediate levels LiM1 and LiM2 in response to the blanket voltage.

Memory cell $204_0$ might be fully inhibited by applying an inhibit voltage (e.g., Vcc) to the bit line $212_0$ coupled to the string $206_0$ that includes memory cells $204_0$ while select transistors $208_0$ to $208_3$ are activated. Memory cell $204_1$ might be partially inhibited by applying a partial inhibit voltage to the bit line $212_1$ coupled to the string $206_1$ that includes memory cells $204_1$ while select transistors $208_0$ to $208_3$ are activated. Memory cell $204_2$ might be partially inhibited by applying a partial inhibit voltage to the bit line $212_2$ coupled to the string $206_2$ that includes memory cells $204_0$ while select transistors $208_0$ to $208_3$ are activated. The partial inhibit voltage that partially inhibits memory cell $204_1$ might be less than the inhibit voltage that fully inhibits memory cell $204_0$ and greater than the voltage applied to the bit line $212_3$ that does not inhibit the memory cell $204_3$; the partial inhibit voltage that partially inhibits memory cell $204_2$ might be less that the partial inhibit voltage that partially inhibits memory cell $204_1$ and greater than the voltage applied to the bit line $212_3$ that does not inhibit the memory cell $204_3$.

Subsequently, in a manner similar to (e.g., the same as) that described in conjunction with FIG. 6 for the memory cells $204_0$ to $204_3$ commonly coupled to word line $202_3$, the memory cell $204_3$ coupled to word line $202_4$ may be programmed from level L0 to intermediate level LiM3 by applying the blanket voltage to word line $202_4$ while memory cell $204_2$ coupled to word line $202_4$ is partially inhibited so that the blanket voltage programs memory cell $204_2$ from level L0 to intermediate level LiM2, while memory cell $204_1$ coupled to word line $202_4$ is partially inhibited so that the blanket voltage programs memory cell $204_1$ from level L0 to intermediate level LiM1, while memory cell $204_0$ coupled to word line $202_4$ is fully inhibited from being programmed in response to the blanket voltage so that memory cell $204_0$ remains at level L0, and while memory cell $204_3$ coupled to word line $202_4$ is not inhibited from programming. The memory cells that are respectively programmed to intermediate levels LiM1, LiM2, and LiM3 might include all of the memory cells of a grouping of memory cells, e.g., commonly coupled to word line $202_4$, to be respectively programmed to levels L1, L2, and L3 other than level L0.

After programming the memory cells $204_1$, $204_2$, and $204_3$ commonly coupled to word lines $202_3$ and $202_4$ respectively to intermediate levels LiM1, LiM2, and LiM3 in response to the blanket voltage, the memory cells $204_1$, $204_2$, and $204_3$ commonly coupled to word line $202_3$ may be respectively programmed to levels L1, L2, and L3 respectively from intermediate levels LiM1, LiM2, and LiM3, e.g., using single-pass programming. The memory cells $204_1$, $204_2$, and $204_3$ commonly coupled to word line $202_3$ might not be read or verified while they are respectively at intermediate levels LiM1, LiM2, and LiM3, e.g., before respectively programming them to levels L1, L2, and L3.

Programming the memory cells $204_1$ to $204_3$ commonly coupled to word line $202_3$ may include, for example, respectively programming memory cells $204_1$, $204_2$, and $204_3$ to levels L1, L2, and L3 respectively from intermediate levels LiM1, LiM2, and LiM3 while memory cell $204_0$ coupled to word line $202_3$ is fully inhibited from programming so that it remains at level L0. Arrows $620_1$, $620_2$, and $620_3$ in FIG. 6 respectively illustrate memory cells $204_1$, $204_2$, $204_3$ being respectively programed to levels L1, L2, and L3 respectively from intermediate levels LiM1, LiM2, and LiM3.

After programming the memory cells $204_1$, $204_2$, and $204_3$ commonly coupled to word line $202_3$ respectively to levels L1, L2, and L3, the memory cells $204_1$, $204_2$, and $204_3$ commonly coupled to word line $202_4$ may be respectively programmed to levels L1, L2, and L3, e.g., using single-pass programming. The memory cells $204_1$, $204_2$, and $204_3$ commonly coupled to word line $202_4$ might not be read or verified while they are respectively at intermediate levels LiM1, LiM2, and LiM3, e.g., before respectively programming them to levels L1, L2, and L3.

Programming the memory cells $204_1$ to $204_3$ commonly coupled to word line $202_4$ may include, for example, respectively programming memory cells $204_1$, $204_2$, and $204_3$ to levels L1, L2, and L3 respectively from intermediate levels LiM1, LiM2, and LiM3 while memory cell $204_0$ coupled to word line $202_4$ is fully inhibited from programming so that it remains at level L0.

The blanket voltage required to program the memory cells to an intermediate level from level L0 might be determined for representative memory devices, e.g., during testing. The determined blanket voltage, such as a voltage of a single programming voltage pulse, may then be programmed into memory devices, e.g., to a register or a portion of a memory array of the memory devices, or hard programmed, using fuses, during their manufacture. The voltage of the single programming voltage pulse might be read from the register or the portion of the memory array, for example.

The blanket voltage might be applied to a word line by applying the single programming voltage pulse, having a voltage level (e.g., magnitude) equal to the blanket voltage, to the word line, for example. For example, the voltage level may be stored in and read from the register. Alternatively, for other examples, the blanket voltage might be applied to a word line by applying a plurality of voltage pulses to the word line, starting at a starting voltage, and successively incrementing the voltage pulses by a blanket step voltage (e.g., ranging from about 0.8 volt to about 1.2 volts) without applying any verify operations after any of the voltage pulses. For example, two voltage pulses might be applied to the word line, e.g., a first voltage pulse that has a voltage equal to the starting voltage followed by a second voltage pulse that has a voltage equal to the starting voltage pulse the blanket step voltage, without performing a verify operation between applying the first and second voltage pulses. There may be no need to verify or otherwise determine if a memory cell has reached a particular threshold voltage with regard to second voltage pulse. For example, memory cells might not be read or verified while they are at an intermediate level resulting from the application of the second voltage pulse, e.g., before the memory cells are programmed to level L1, L2, or L3 from that intermediate level.

The starting voltage might be based on how fast the memory cells program and/or how many program/erase cycles have been performed on the memory cells, where a program/erase cycle might include first erasing a memory cell and then programming the memory cell. For example, the starting voltage might be decreased for faster programming memory cells and increased for slower programming memory cells. Memory cells might program faster as the number of program/erase cycles increase. Therefore, the starting voltage might be decreased as the number of program/erase cycles increases.

In examples where only a single programming voltage pulse is applied, the blanket voltage might be increased or decreased according to the programming speed of the memory cells or decreased with an increasing number of program/erase cycles. The single programming voltage pulse or starting voltage might be based on a number of program/erase cycles applied to the word line to which the memory cells to be programed with the blanket voltage or starting voltage are commonly coupled or to a memory block that includes that word line.

Although the partial and/or full inhibiting of the memory cells discussed in in conjunction with the examples presented in FIGS. 3-6 was in response to applying partial and/or full inhibit voltages to the bit lines coupled to the strings containing those memory cells, the partial and/or full inhibiting of the memory cells discussed in conjunction with the examples presented in FIGS. 3-6 might be alternatively accomplished by appropriately boosting the voltages on the channels of those memory cells, for example.

Figure 7:
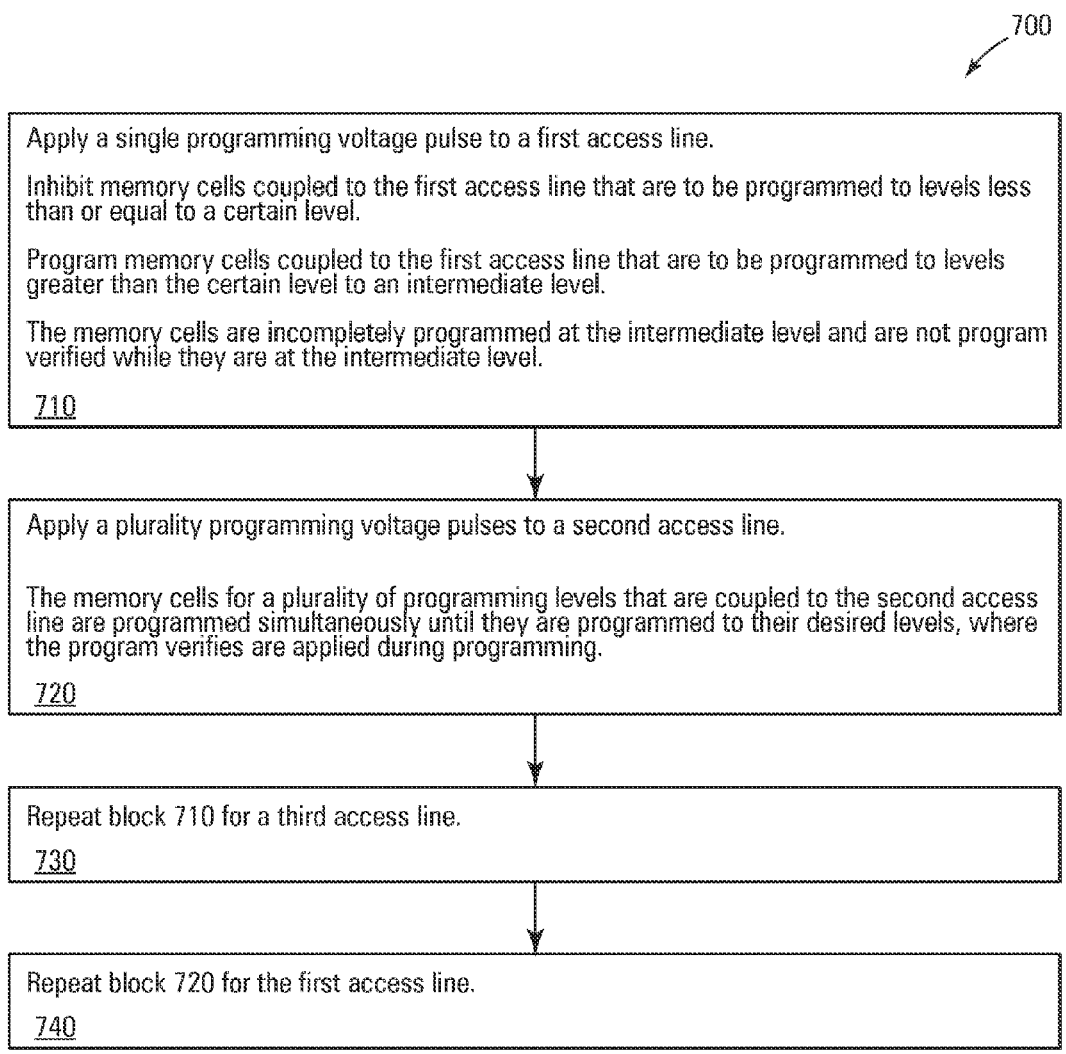
FIG. 7 is a flowchart of an example of a method for programming a memory device.

FIG. 7 is a flowchart of an example of a method 700 for programming a memory device, such as memory device 800, described below in conjunction with FIG. 8. For example, at block 710, a single programming voltage pulse is applied to a first access line, such as word line $202_4$ in FIG. 2. The memory cells commonly coupled to the first word line for programming levels less than or equal to a certain level, such as memory cells for level L1 and level L0 programming for level L1 being the certain level or memory cells for level L2, level L1, and level L0 programming for level L2 being the certain level, might be fully inhibited while the single programming voltage pulse is applied to the first access line. The memory cells commonly coupled to the first access line to be programmed to a level greater than the certain level, such as memory cells for level L2 and level L3 programming for level L1 being the certain level or memory cells for level L3 programming for level L2 being the certain level, might be programmed to the intermediate level Li in FIG. 3 in response to the single programming voltage pulse, for example, from a level corresponding to a lowest data state, such as level L0 in FIGS. 1 and 3. None of memory cells programmed to the intermediate level is completely programmed at the intermediate level and none of memory cells programmed to the intermediate level is program verified while at the intermediate level.

For example, for level L1 being the certain level, the memory cells coupled to the first access line for level L2 and level L3 programming are programmed to the intermediate level Li from level L0 while the single programming voltage pulse is applied to the first access line and while the memory cells coupled to the first access line for level L1 and level L0 programming are fully inhibited. For level L2 being the certain level, for example, the memory cells coupled to the first access line for level L3 programming are programmed to the intermediate level Li from level L0 while the single programming voltage pulse is applied to the first access line and while the memory cells coupled to the first access line for level L2, level L1, and level L0 programming are fully inhibited.

At block 720, a plurality of increasing programming voltage pulses are applied to a second access line, such as word line $202_3$ in FIG. 2, after applying the single programming voltage pulse to the first access line and after programming the memory cells coupled to the first access line to be programmed to levels L2 and L3 when level L1 is the certain level or to level L3 when level L2 is the certain level are programmed to the intermediate level. For example, a starting voltage for the plurality programming pulses might be greater than the voltage of the single programming voltage pulse used in block 710, and the pulses may be respectively incremented by a step voltage, starting from the starting voltage. The memory cells commonly coupled to the second access line for a plurality of programming levels may be programmed simultaneously in response to the plurality of increasing programming voltage pulses until they are programmed to their desired levels, where program verifies are applied during the programming. For example, a program verify voltage might be applied to the second access line after applying each of the plurality of increasing programming pulses.

The memory cells coupled to the second access line, for example, might be respectively programmed to the levels L1 to L3. In some examples, some of memory cells commonly coupled to the second access line might have been programmed to the intermediate level as described in conjunction with block 710, such as memory cells to be programmed to levels L2 and L3 while the memory cells for level L1 and level L0 programming are inhibited, as described in conjunction with block 710, or memory cells to be programmed level L3 while the memory cells for level L2, level L1, and level L0 programming are inhibited, as described in conjunction with block 710.

For example, the memory cells commonly coupled to the second access line for level L1 programming that were inhibited might be programmed to level L1 from the level L0 while the memory cells commonly coupled to the second access line for level L2 and level L3 programming that were programmed to the intermediate level might be respectively programmed to level L2 and level L3 from the intermediate level. For example, the memory cells commonly coupled to the second access line for level L1 and level L2 programming that were inhibited might be respectively programmed to level L1 and level L2 from the level L0 while the memory cells commonly coupled to the second access line for level L3 programming that were programmed to the intermediate level might be programmed to level L3 from the intermediate level.

In block 730, e.g., after completing block 720 for the second access line, block 710 may be repeated for the memory cells commonly coupled to a third access line, such as word line $202_5$ in FIG. 2. In block 740, e.g., after competing block 730 for the third access line and after completing block 710 for the first access line, block 720 may be repeated for the memory cells commonly coupled to the first access line.

Figure 8:
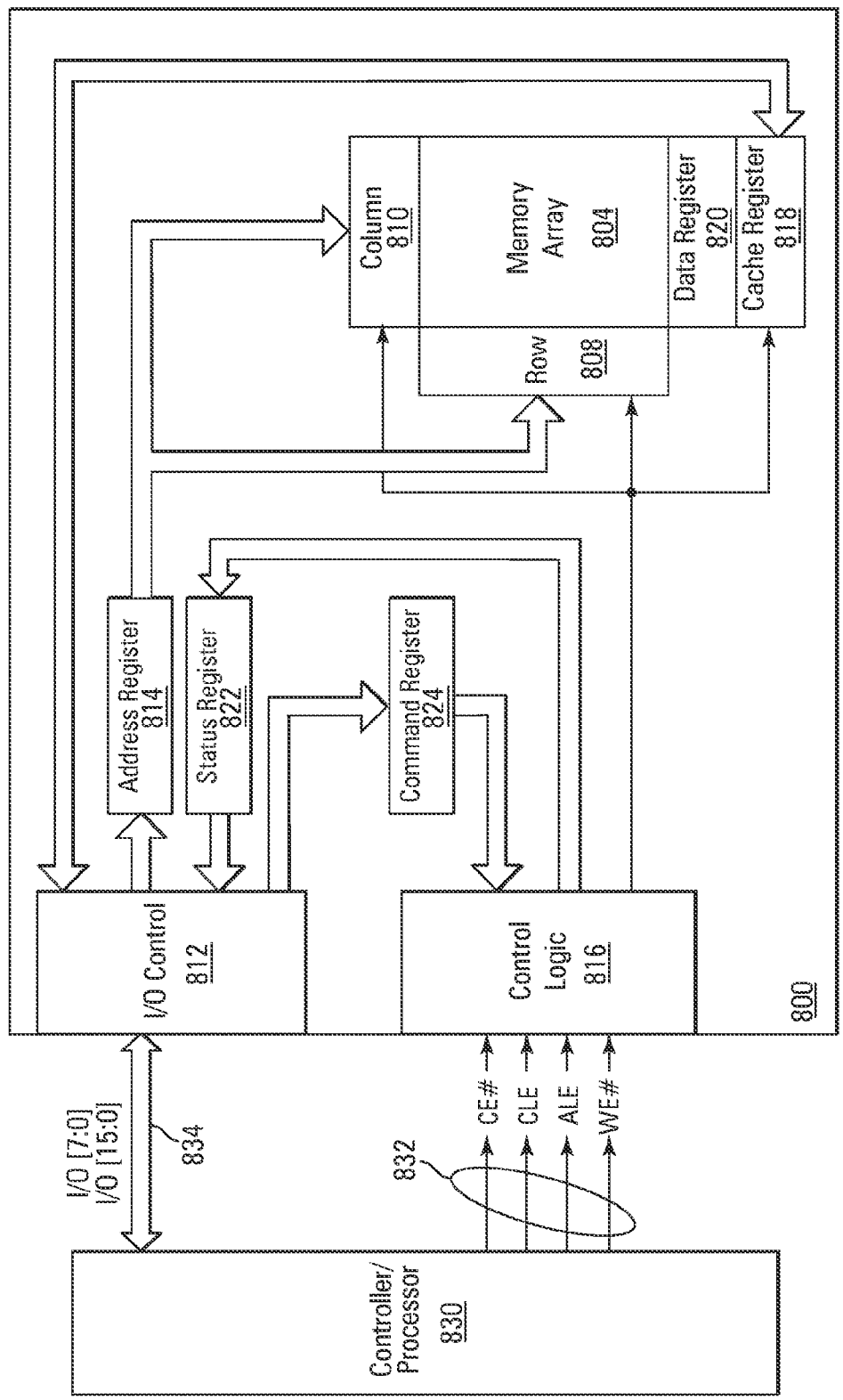
FIG. 8 is a simplified block diagram of an electronic system, according to an embodiment.

FIG. 8 is a simplified block diagram of an electronic device, e.g., an integrated circuit device, such as a memory device 800, in communication with a controller 830, such as a memory controller, e.g. a host controller, as part of an electronic system, according to an embodiment. Memory device 800 might be a NAND flash memory device, for example.

Controller 830 might include a processor, for example. Controller 830 might be coupled to a host, for example, and may receive command signals (or commands), address signals (or addresses), and data signals (or data) from the host and may output data to the host.

Memory device 800 includes an array of memory cells 804 that might include array 200 of FIG. 2. Memory array 804 may be what is often referred to as a two-dimensional array, where the memory cells might be in a single physical (e.g., vertical) plane, or a stacked memory array, e.g., what is often referred to as a three-dimensional memory array, where memory cells might be in different physical (e.g., vertical) planes. A row decoder 808 and a column decoder 810 might be provided to decode address signals. Address signals are received and decoded to access memory array 804.

Memory device 800 might also include input/output (I/O) control circuitry 812 to manage input of commands, addresses, and data to the memory device 800 as well as the output of data and status information from the memory device 800. An address register 814 is in communication with I/O control circuitry 812, and row decoder 808 and column decoder 810, to latch the address signals prior to decoding. A command register 824 is in communication with I/O control circuitry 812 and control logic 816, to latch incoming commands. Control logic 816 controls access to the memory array 804 in response to the commands and generates status information for the external controller 830. The control logic 816 is in communication with row decoder 808 and column decoder 810 to control the row decoder 808 and column decoder 810 in response to the addresses.

Control logic 816 can be included in controller 830. Controller 830 can include, other circuitry, firmware, software, or the like, whether alone or in combination. Controller 830 can be an external controller (e.g., in a separate die from the memory array 804, whether wholly or in part) or an internal controller (e.g., included in a same die as the memory array 804). For example, an internal controller might be a state machine or a memory sequencer.

Controller 830 may be configured to cause memory device 800 to perform the methods disclosed herein, including method 700 described above in conjunction with FIG. 7. For example, controller 830 might be configured to cause the memory device 800 to program all memory cells of a grouping of memory cells that are to be respectively programmed to different levels other than a lowest level, corresponding to a lowest data state, to an intermediate level from the lowest level and to cause the memory device 800 to respectively program all the memory cells of the grouping of memory cells that are to be respectively programmed to the different levels other than the lowest level to the different levels other than the lowest level from the intermediate level.

In another example, controller 830 might be configured to cause the memory device 800 to program all memory cells of a grouping of memory cells that are to be respectively programmed to different levels other than a lowest level, corresponding to a lowest data state, respectively to different intermediate levels from the lowest level and to cause the memory device 800 to respectively program the memory cells to the different levels respectively from the different intermediate levels.

In another example, controller 830 might be configured to cause the memory device 800 to program all memory cells of a grouping of memory cells commonly coupled to a first access line that are to be respectively programmed to different levels other than a lowest level, corresponding to a lowest data state, to an intermediate level from the lowest level, to cause the memory device 800 to program all memory cells of a grouping of memory cells commonly coupled to a second access line, adjacent to the first access line, that are to be respectively programmed to the different levels other than the lowest level to the intermediate level from the lowest level after all the memory cells of a grouping of memory cells commonly coupled to the first access line that are to be respectively programmed to the different levels other than the lowest level are programmed to the intermediate level, and to cause the memory device 800 to program all the memory cells of a grouping of memory cells commonly coupled to the first access line that are to be respectively programmed to the different levels other than the lowest level respectively to the different levels other than the lowest level from the intermediate level after all the memory cells of a grouping of memory cells commonly coupled to the second access line that are to be respectively programmed to different levels other than the lowest level are programmed to the intermediate level.

Control logic 816 is also in communication with a cache register 818. Cache register 818 latches data, either incoming or outgoing, as directed by control logic 816 to temporarily store data while the memory array 804 is busy writing or reading, respectively, other data. During a write operation, data is passed from the cache register 818 to data register 820, e.g., that might include a page buffer, for transfer to the memory array 804; then new data is latched in the cache register 818 from the I/O control circuitry 812. During a read operation, data is passed from the cache register 818 to the I/O control circuitry 812 for output to controller 830 and subsequent output to a host; then new data is passed from the data register 720 to the cache register 818. A status register 822 is in communication with I/O control circuitry 812 and control logic 816 to latch the status information for output to the controller 830.

Memory device 800 receives control signals at control logic 816 from controller 830 over a control link 832. The control signals may include at least a chip enable CE#, a command latch enable CLE, an address latch enable ALE, and a write enable WE#. Memory device 800 receives command signals (which represent commands), address signals (which represent addresses), and data signals (which represent data) from controller 830 over a multiplexed input/output (I/O) bus 834 and outputs data to controller 830 over I/O bus 834.

For example, the commands are received over input/output (I/O) pins [7:0] of I/O bus 834 at I/O control circuitry 812 and are written into command register 824. The addresses are received over input/output (I/O) pins [7:0] of bus 834 at I/O control circuitry 812 and are written into address register 814. The data are received over input/output (I/O) pins [7:0] for an 8-bit device or input/output (I/O) pins [15:0] for a 16-bit device at I/O control circuitry 812 and are written into cache register 818. The data are subsequently written into data register 820 for programming memory array 804. For another embodiment, cache register 818 may be omitted, and the data are written directly into data register 820. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 800 of FIG. 8 has been simplified. It should be recognized that the functionality of the various block components described with reference to FIG. 8 may not necessarily be segregated to distinct components or component portions of an integrated circuit device. For example, a single component or component portion of an integrated circuit device could be adapted to perform the functionality of more than one block component of FIG. 8. Alternatively, one or more components or component portions of an integrated circuit device could be combined to perform the functionality of a single block component of FIG. 8.

Additionally, while specific I/O pins are described in accordance with popular conventions for receipt and output of the various signals, it is noted that other combinations or numbers of I/O pins may be used in the various embodiments.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of programming a memory device, comprising:
   programming memory cells of a grouping of memory cells to an intermediate level from a lowest level corresponding to a lowest data state, wherein the memory cells that are programmed to the intermediate level comprise all the memory cells of the grouping of memory cells that are to be programmed from the intermediate level to levels other than the lowest level; and
   respectively programming different memory cells of the memory cells that are programmed to the intermediate level to different levels of the levels other than the lowest level from the intermediate level.

2. The method of claim 1, wherein the intermediate level represents a range of threshold voltages.

3. The method of claim 1, wherein the memory cells that are programmed to the intermediate level are commonly coupled to a single access line and are programmed to the intermediate level in response to applying a single programming voltage pulse to the single access line.

4. The method of claim 3, wherein the single programming voltage pulse is based on a number of program/erase cycles applied to the single access line or to a memory block that includes the single access line.

5. The method of claim 1, wherein the memory cells that are programmed to the intermediate level are commonly coupled to a single access line and are programmed to the intermediate level in response to:
   applying a first voltage pulse to the single access line; and
   applying a second voltage pulse to the single access line after applying the first voltage pulse to the single access line;
   wherein the second voltage pulse is the first voltage pulse incremented by a step voltage.

6. The method of claim 5, where no verify operation is performed between applying the first and second voltage pulses.

7. The method of claim 1, wherein programming the memory cells of the grouping of memory cells to the intermediate level from the lowest level comprises:
programming memory cells of a first grouping of memory cells commonly coupled to a first access line to the intermediate level from the lowest level; and
programming memory cells of a second grouping of memory cells commonly coupled to a second access line, adjacent to the first access line, to the intermediate level from the lowest level;
wherein the memory cells of the first grouping of memory cells that are programmed to the intermediate level from the lowest level comprise all the memory cells of the first grouping of memory cells that are to be programmed from the intermediate level to the levels other than the lowest level; and
wherein the memory cells of the second grouping of memory cells that are programmed to the intermediate level from the lowest level comprise all the memory cells of the second grouping of memory cells that are to be programmed from the intermediate level to the levels other than the lowest level.

8. The method of claim 7, wherein respectively programming the different memory cells of the memory cells that are programmed to the intermediate level to the different levels of the levels other than the lowest level from the intermediate level comprises:
respectively programming different memory cells of the first grouping of memory cells that are programmed to the intermediate level to the different levels of the levels other than the lowest level from the intermediate level; and
after respectively programming the different memory cells of the first grouping of memory cells to the different levels of the levels other than the lowest level from the intermediate level, respectively programming different memory cells of the second grouping of memory cells that are programmed to the intermediate level to the different levels of the levels other than the lowest level from the intermediate level.

9. The method of claim 8, wherein the memory cells of the first grouping of memory cells that are programmed to the intermediate level from the lowest level are programmed to the intermediate level from the lowest level before the memory cells of the second grouping of memory cells are programmed to the intermediate level from the lowest level.

10. The method of claim 1, wherein programming the memory cells of the grouping of memory cells to the intermediate level from the lowest level comprises programming first memory cells of the grouping of memory cells to the intermediate level from the lowest level, wherein at least one second memory cell of the grouping of memory cells is to remain at the lowest level, and further comprising inhibiting the at least one second memory cell while programming the first memory cells of the grouping of memory cells to the intermediate level from the lowest level.

11. The method of claim 1, wherein the memory cells are not read or verified at the intermediate level.

12. A memory device, comprising:
a controller;
wherein the controller is configured to cause the memory device to program memory cells of a grouping of memory cells to an intermediate level from a lowest level corresponding to a lowest data state, wherein the memory cells that are caused to be programmed to the intermediate level from the lowest level comprise all the memory cells of the grouping of memory cells that are to be programmed from the intermediate level to levels other than the lowest level;
wherein the controller is configured to cause the memory device to respectively program different memory cells of the memory cells that are caused to be programmed to the intermediate level to different levels of the levels other than the lowest level from the intermediate level.

13. The memory device of claim 12, wherein the memory cells that are caused to be programmed to the intermediate level are commonly coupled to a single access line, wherein the controller is configured to cause the memory device to apply a single programming voltage pulse to the single access line so that the memory cells that are caused to be programmed to the intermediate level are caused to be programmed to the intermediate level in response to the single programming voltage pulse.

14. The memory device of claim 13, wherein the single programming voltage pulse is based on a number of program/erase cycles applied to the single access line or to a memory block that includes the single access line.

15. The memory device of claim 13, wherein a voltage of the single programming voltage pulse is stored on the memory device.

16. The memory device of claim 12, wherein the memory cells that are caused to be programmed to the intermediate level are commonly coupled to a single access line, and wherein the controller being configured to cause the memory device to program the memory cells of the grouping of memory cells to the intermediate level from the lowest level comprises:
the controller being configured to cause the memory device to apply a first voltage pulse to the single access line; and
the controller being configured to cause the memory device to apply a second voltage pulse to the single access line after the first voltage pulse is applied to the single access line;
wherein the second voltage pulse is the first voltage pulse incremented by a step voltage.

17. The memory device of claim 16, where no verify operation is performed between applying the first and second voltage pulses.

18. The memory device of claim 12, wherein the controller being configured to cause the memory device to program the memory cells of the grouping of memory cells to the intermediate level from the lowest level comprises:
the controller being configured to cause the memory device to program memory cells of a first grouping of memory cells commonly coupled to a first access line to the intermediate level from the lowest level; and
the controller being configured to cause the memory device to program memory cells of a second grouping of memory cells commonly coupled to a second access line, adjacent to the first access line, to the intermediate level from the lowest level;
wherein the memory cells of the first grouping of memory cells that are programmed to the intermediate level from the lowest level comprise all the memory cells of the first grouping of memory cells that are to be programmed from the intermediate level to the levels other than the lowest level; and
wherein the memory cells of the second grouping of memory cells that are programmed to the intermediate level from the lowest level comprise all the memory cells of the second grouping of memory cells that are to be programmed from the intermediate level to the levels other than the lowest level.

19. The memory device of claim 18, wherein the controller being configured to cause the memory device to respectively program the different memory cells of the memory cells that are caused to be programmed to the intermediate level to the different levels of the levels other than the lowest level from the intermediate level comprises:

the controller being configured to cause the memory device to respectively program different memory cells of the first grouping of memory cells that are programmed to the intermediate level to the different levels of the levels other than the lowest level from the intermediate level; and the controller being configured, after the different memory cells of the first grouping of memory cells are respectively programmed to the different levels of the levels other than the lowest level from the intermediate level, to respectively program different memory cells of the second grouping of memory cells that are programmed to the intermediate level to the different levels of the levels other than the lowest level from the intermediate level.

20. The memory device of claim 19, wherein the controller is configured to cause the memory device to program the memory cells of the first grouping of memory cells to the intermediate level from the lowest level before causing the memory device to program the memory cells of the second grouping of memory cells to the intermediate level from the lowest level.

21. The memory device of claim 12, wherein the memory cells that are caused to be programmed to the intermediate level from the lowest level are first memory cells of the grouping of memory cells, wherein at least one second memory cell of the grouping of memory cells is to remain at the lowest level, and wherein the controller is configured to cause the memory device to inhibit the at least one second memory cell of the grouping of memory cells while the first memory cells are caused to be programmed to the intermediate level from the lowest level.

* * * * *